US006217786B1

United States Patent
Hills et al.

(10) Patent No.: US 6,217,786 B1
(45) Date of Patent: Apr. 17, 2001

(54) MECHANISM FOR BOW REDUCTION AND CRITICAL DIMENSION CONTROL IN ETCHING SILICON DIOXIDE USING HYDROGEN-CONTAINING ADDITIVE GASES IN FLUOROCARBON GAS CHEMISTRY

(75) Inventors: Graham Hills, Los Gatos; Thomas D. Nguyen, Campbell; Douglas Keil, Fremont; Keyvan Khajehnouri, San Jose, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/223,963

(22) Filed: Dec. 31, 1998

(51) Int. Cl.[7] .............................. B44C 1/22; H01L 21/302
(52) U.S. Cl. ............................................. 216/79; 438/710
(58) Field of Search .................................. 438/710, 706, 438/711, 268, 696, 707, 730; 216/58, 67, 2, 79, 96, 80, 99, 104, 102, 109

(56) References Cited

U.S. PATENT DOCUMENTS

| | | | |
|---|---|---|---|
| 5,462,896 | 10/1995 | Komura et al. | 437/228 |
| 5,871,659 | * 2/1999 | Sakano et al. | 216/79 |
| 6,051,504 | * 4/2000 | Armacost et al. | 438/706 |
| 6,080,662 | * 6/2000 | Chen et al. | 438/637 |
| 6,083,844 | * 7/2000 | Bui-Le et al. | 438/720 |

FOREIGN PATENT DOCUMENTS

| | | | |
|---|---|---|---|
| 0 658 928A1 | 6/1995 | (EP) | H01L/21/311 |
| 0 805 485A2 | 11/1997 | (EP) | H01L/21/311 |
| 0 840 365A2 | 5/1998 | (EP) | H01L/21/311 |
| 0 805 485A3 | 9/1999 | (EP) | H01L/21/311 |

OTHER PUBLICATIONS

PCT Notification of Transmittal of the International Search Report or the Declaration, dated Mar. 27, 2000, 5 pages.

Yukio Iijima et al., "Highly Selective $SiO_2$ Etch Employing Inductively Coupled Hydro–Fluorocarbon Plasma Chemistry for Self Aligned Contact Etch", Jpn. J. Appl. Phys. vol. 36 (1997) pp. 5498–5501.

Kubota et al, "Measurement of Fluorocarbon Radicals generated from $C_4F_8/H_2$ Inductively Coupled Plasma: Study on $SiO_2$ Selective Etching Kinetics", Jpn. J. Appl. Phys. vol. 34 (1995) pp. 2119–2124. Part 1, No. 4B, Apr. 1995.

Hayashi et al., "Characterization of Highly Selective $SiO_2/Si_3N_4$ Etching of High–Aspect–Ratio Holes", Jpn. J. Appl. Phys. vol. 35 (1996) pp. 2488–2493. Part 1, No. 4B, Apr. 1996.

Ikegami et al., "Characteristics of Very High–Aspect–Ratio Contact Hole Etching", Jpn. J. Appl. Phys. vol. 36 (1997) pp. 2470–2476. Part 1, No. 4B, Apr. 1997.

Ikegami et al., "Vertical Profile Control in Ultrahigh–Aspect–Ratio Contact Hole Etching with 0.05–$\mu$m–Diameter Range", Jpn. J. Appl. Phys. vol. 37 (1998) pp. 2337–2342. Part 1, No. 4B.

* cited by examiner

*Primary Examiner*—Gregory Mills
*Assistant Examiner*—P. Hassanzadeh
(74) *Attorney, Agent, or Firm*—Beyer Weaver & Thomas, LLP

(57) ABSTRACT

A method of etching an oxide layer in a plasma etching reactor is disclosed. The method includes the steps of providing a semiconductor substrate including the oxide layer into the plasma etching reactor and flowing an etching gas that includes a fluorocarbon gas, a nitrogen reactant gas, an oxygen reactant gas, an inert carrier gas, and a hydrogen-containing additive gas into the plasma etching reactor. The method further includes etching an opening at least partially through the oxide layer using a plasma that is formed from the etching gas.

32 Claims, 4 Drawing Sheets

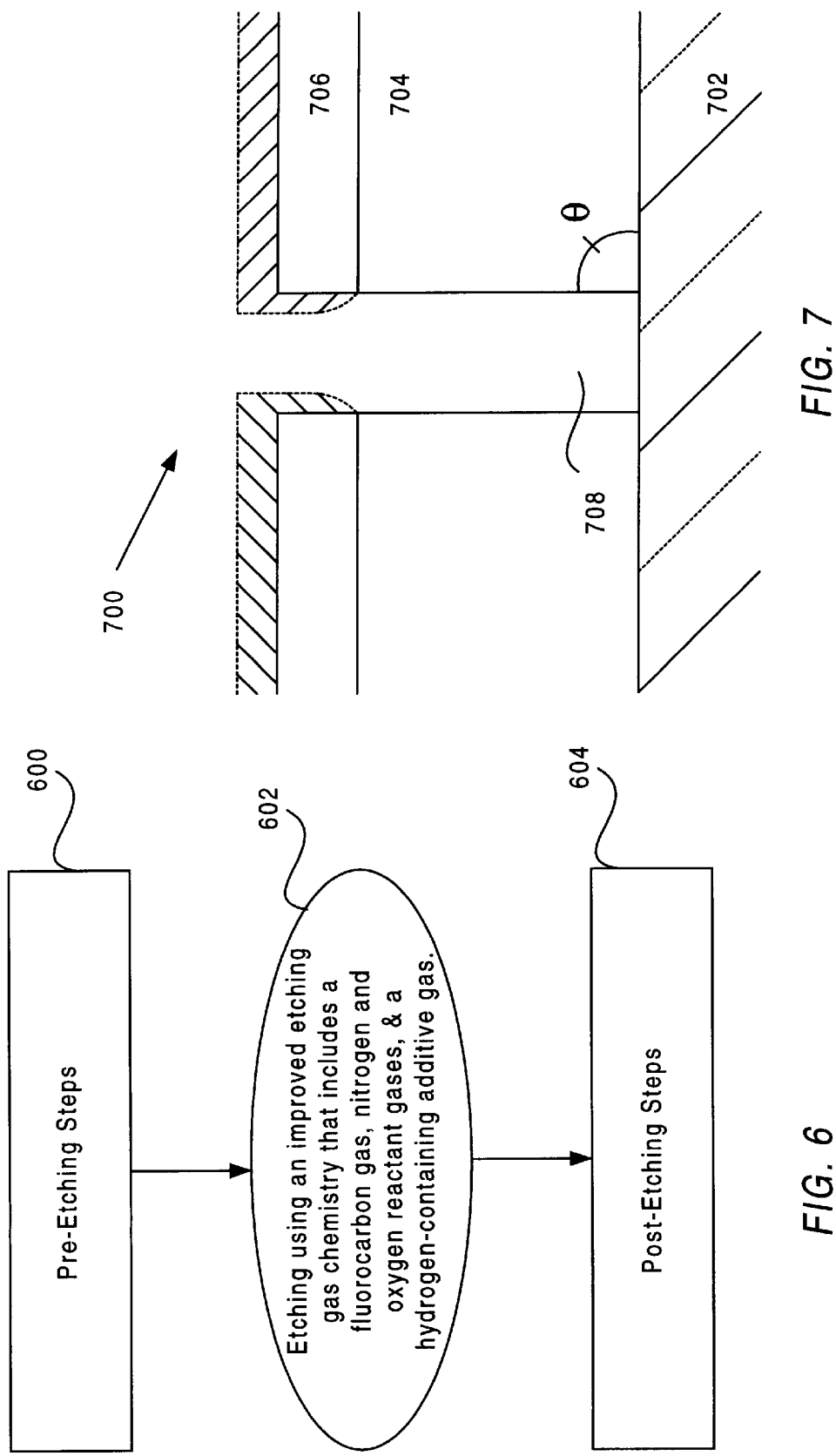

MECHANISM FOR BOW REDUCTION AND CRITICAL DIMENSION CONTROL IN ETCHING SILICON DIOXIDE USING HYDROGEN-CONTAINING ADDITIVE GASES IN FLUOROCARBON GAS CHEMISTRY

BACKGROUND OF THE INVENTION

This invention relates to the fabrication of semiconductor integrated circuits (ICs). More particularly, the present invention relates to improved methods and apparatus for etching an oxide layer in a plasma processing chamber.

In semiconductor IC fabrication, devices such as component transistors may be formed on a semiconductor wafer or substrate, which is typically made of silicon. Above the wafer, there may be disposed a plurality of layers from which the devices may be fabricated. Openings such as contacts and vias are etched in an oxide layer, which may be doped or undoped silicon oxide, pure silicon dioxide or silicates doped with boron, phosphorus, arsenic, or the like. Some types of oxides commonly used in the industry include, by way of example, tetra ethyl oxysilane (TEOS), boro-phosphosilicate glass (BPSG), spin-on glass (SOG), and phosphosilicate glass (PSG). The oxide layer can overlie a conductive or semiconductive layer such as polycrystalline silicon, metals such as aluminum, copper, titanium, tungsten, or alloys thereof, nitrides such as titanium nitride, or metal silicides such as titanium silicide, cobalt silicide, tungsten silicide, etc. To facilitate this discussion, FIG. 1 illustrates a cross-sectional view of a layer stack 100, representing the layers of an exemplar semiconductor IC. In the discussions that follow, it should be noted that other additional layers above, below, or between the layers shown may be present. Further, not all of the shown layers need necessarily be present and some or all may be substituted by other different layers.

At the bottom of layer stack 100, there is shown a wafer 102, which may be made of silicon or metal silicide. A metal layer 104 may be formed above wafer 102. An oxide layer 106, typically comprising $SiO_2$, may be formed above metal layer 104. An overlaying photoresist (PR) layer 108, may then be formed atop oxide layer 106. Photoresist layer 108 represents a layer of conventional photoresist material, which may be patterned for etching, e.g., through exposure to ultra-violet rays. The layers of layer stack 100 are only exemplary and are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form openings in the oxide layer, a portion of oxide layer 106 is etched using a suitable photoresist technique. By way of example, one such photoresist technique involves the patterning of photoresist layer 108 by exposing the photoresist material in a contact or stepper lithography system, and the development of the photoresist material to form a mask to facilitate subsequent etching. Using appropriate etchants, the areas of the oxide layer that are unprotected by the mask may then be etched away, leaving behind openings which may then be filled with metal to form the interconnect lines. For illustration purposes, FIG. 2 shows a cross-sectional view of layer stack 100 of FIG. 1 having an opening 110 in oxide layer 106 after conventional etching is completed.

To achieve greater circuit density, modern IC circuits are scaled with increasingly narrower design rules. As a result, the feature sizes, i.e., the width of the interconnect lines or the spacings (e.g., trenches) between adjacent openings, have steadily decreased, thus giving rise to the need to etch narrower and deeper openings. By way of example, while an opening diameter of approximately 0.8 microns ($\mu$m) may be considered acceptable in a 4 megabit (Mb) dynamic random access memory (DRAM) IC, 256 Mb DRAM IC's preferably employ openings of higher aspect ratios with widths as small as 0.25 microns or even smaller.

With reference to FIG. 3, faceting of the photoresist 302 (as shown by facets 304) while etching the oxide layer 306 may cause the upper region of opening 308 to have a larger cross-sectional dimension than the cross-sectional dimension of the bottom region of opening 308. This loss of critical dimension control may be observed with aspect ratios as low as 3:1. The degradation in the desired vertical sidewall profile may be better understood with reference to FIG. 4.

FIG. 4 illustrates a cross-sectional view of a layer stack 400 having oxide layer 402 overlying a silicon substrate 404. A patterned photoresist layer 406 overlies oxide layer 402. A deep and narrow opening 408 (e.g., having an aspect ratio of 5:1 or greater) is etched in to oxide layer 402 using the prior art gas chemistry, which results in bowed sidewalls 410 due to lower passivation of the sidewalls relative to the passivation that takes place at the bottom of the opening. Adding more fluorocarbon to the etching gas chemistry could increase the passivation somewhat, but would also cause an etch stop to occur in oxide layer 402. The presence of bowed sidewalls 410 makes it difficult to fill opening 408 with metal to form an electrically sound contact since the top portion of the opening, having a smaller cross-section than the lower part due to the bowed sidewalls, will pinch off before the lower portion is entirely filled with metal, thus causing a void in the contact.

It should be appreciated by those skilled in the art that both loss of critical dimension control and the bowing sidewalls are undesired as either of these two characteristics may result in problems with maintaining substantially straight vertical profiles as well as correct sizing for the etched openings. In view of the foregoing, there are desired improved techniques of etching deep and narrow openings in an oxide layer.

SUMMARY OF THE INVENTION

To achieve the foregoing and other objects and according to the purpose of the present invention, a method of etching an oxide layer in a plasma etching reactor is disclosed. The method includes the steps of providing a semiconductor substrate including the oxide layer into the plasma etching reactor and flowing an etching gas that includes a fluorocarbon gas, a nitrogen reactant gas, an oxygen reactant gas, an inert carrier gas, and a hydrogen-containing additive gas into the plasma etching reactor. The method further includes etching an opening at least partially through the oxide layer using a plasma that is formed from the etching gas.

In another embodiment of the present invention, a method of etching an oxide layer in a parallel-plate plasma etching reactor is disclosed. The method includes the steps of providing a semiconductor substrate having an oxide layer into the plasma etching reactor and flowing an etching gas that includes a fluorocarbon gas having a formula of $C_nF_m$ gas wherein n is at least 2 and m is greater than n, $N_2$, $O_2$, an inert carrier gas, and a hydrogen-containing additive gas into the plasma etching reactor. The method further includes the step of etching an opening at least partially through the oxide layer using a plasma that is formed from the etching gas.

BRIEF DESCRIPTION OF THE DRAWINGS

FIG. 6 shows, in accordance with one aspect of the invention, the steps involved in the method of etching deep and narrow openings using the inventive etching gas chemistry.

FIG. 7 illustrates a cross-sectional view of a layer stack having a deep and narrow opening with a substantially straight vertical profile that was etched using the improved gas chemistry.

DETAILED DESCRIPTION OF THE PREFERRED EMBODIMENTS

The present invention will now be described in detail with reference to a few preferred embodiments thereof as illustrated in the accompanying drawings. The purpose of this invention is to achieve a substantially straight vertical profile of an opening in the oxide layer while maintaining critical dimension control. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
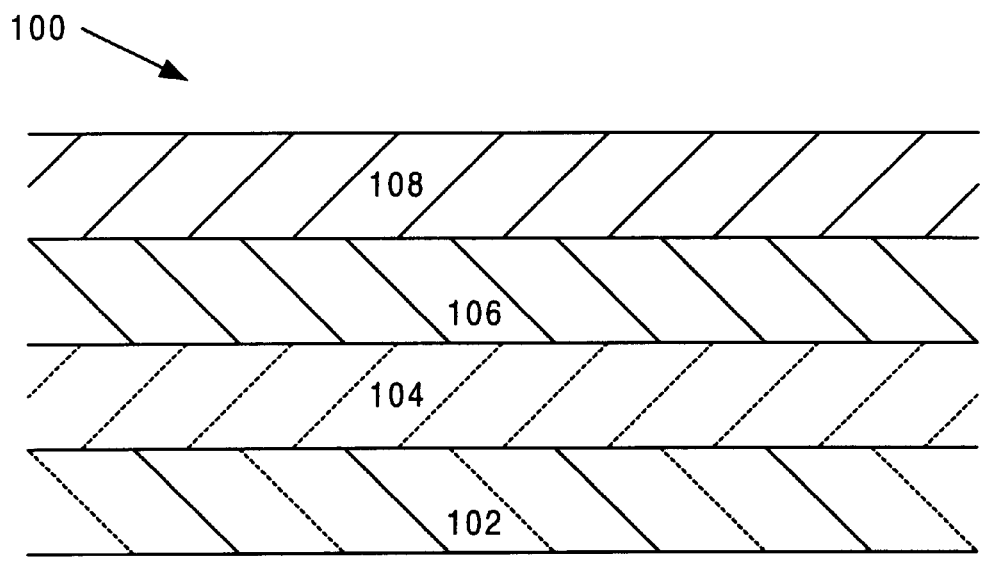
FIG. 1 illustrates a cross-sectional view of a layer stack, representing layers formed during the fabrication of a typical semiconductor integrated circuit (IC) device.
Figure 2:
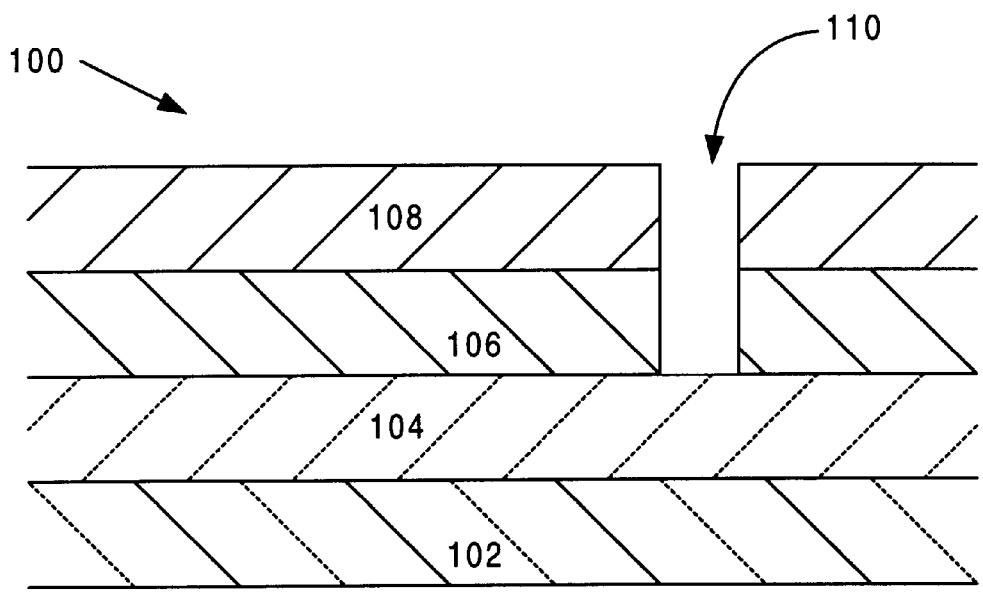
FIG. 2 illustrates a cross-sectional view of the layer stack of FIG. 1 after conventional etching is completed.
Figure 3:
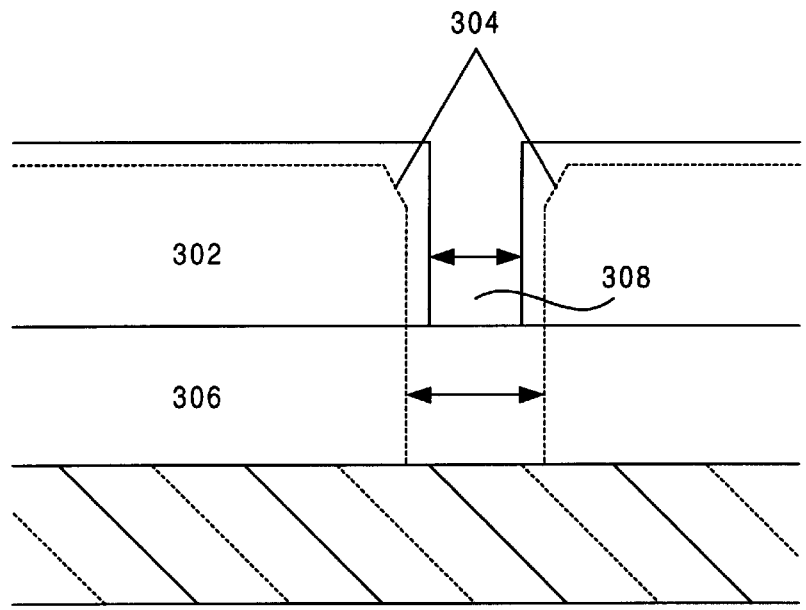
FIG. 3 illustrates a cross-sectional view of a layer stack, showing the problems of losing critical dimension control in the profile of a contact opening in the oxide layer that is etched using the prior art gas chemistry.
Figure 4:
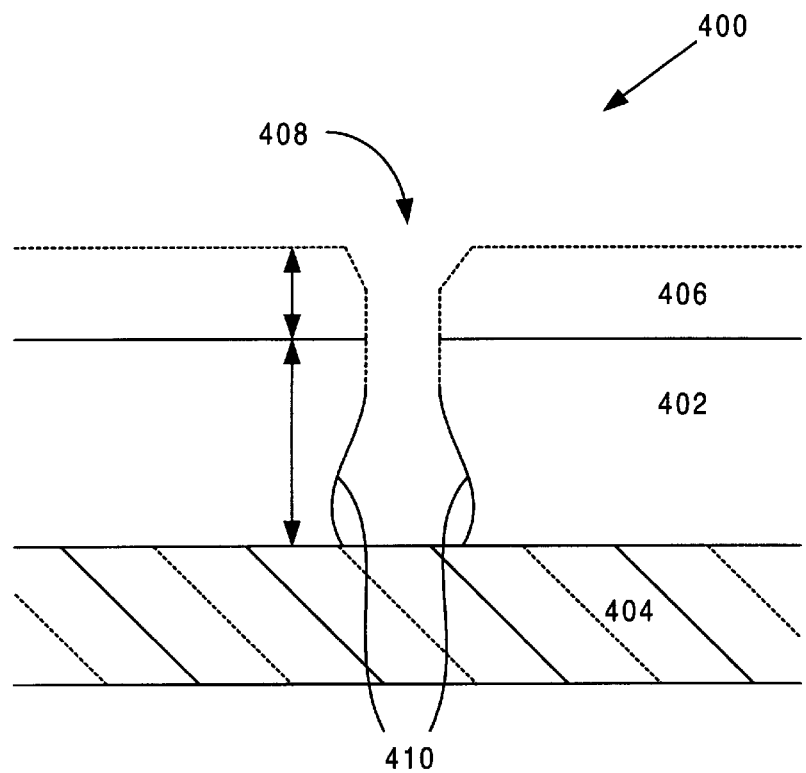
FIG. 4 illustrates a cross-sectional view of a layer stack having a deep and narrow opening with bowed sidewalls that were formed by etching with the prior art gas chemistry.

In accordance with one aspect of the present invention, the aforementioned problems of bowing sidewalls and loss of critical dimension control may be alleviated by etching an oxide layer, such as the examples shown in FIGS. 1 and 3, using a number of different etching gas chemistries which preferably include a hydrogen containing additive gas.

Figure 5:
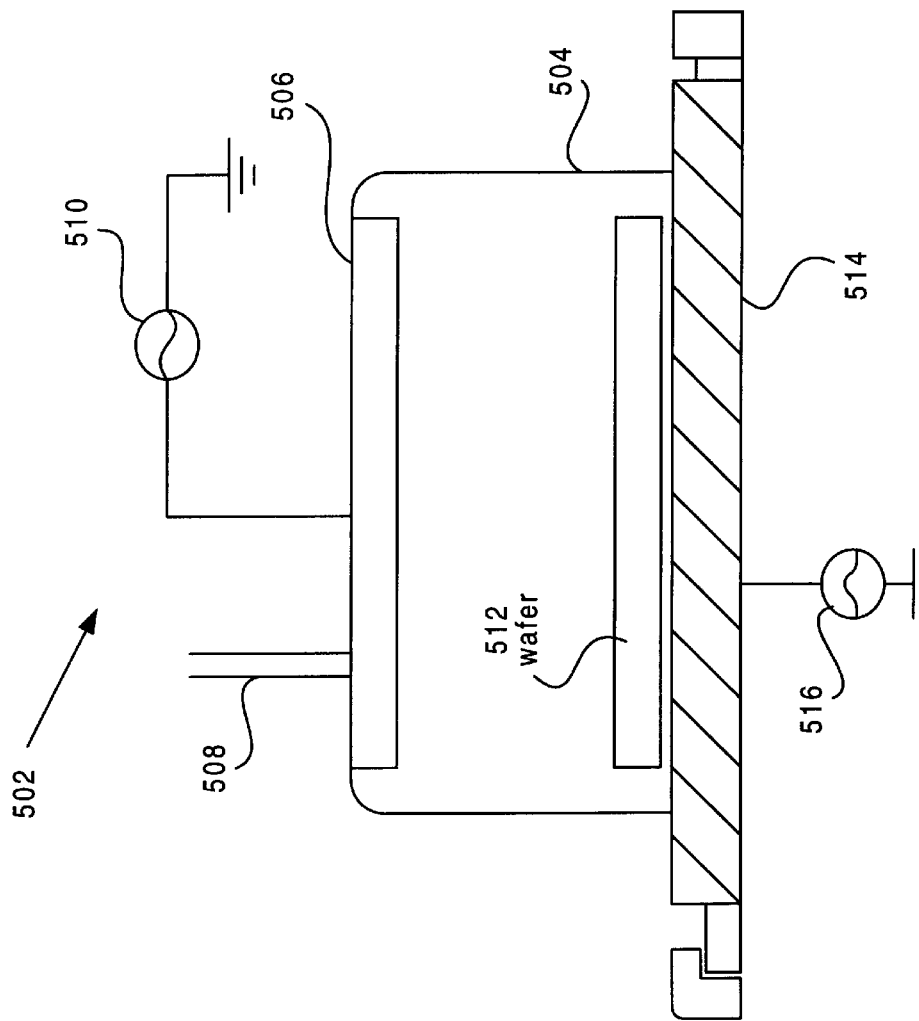
FIG. 5 is a simplified diagram of a plasma reactor that may be suitably employed with the improved gas chemistry in accordance with one aspect of the invention.

In a preferred embodiment, the present invention is employed in a 4520XL™ plasma reactor, which is available from Lam Research Corporation of Fremont, Calif. FIG. 5 illustrates a simplified schematic of the 4520XL™ plasma reactor which represents the preferred plasma processing reactor for practicing the invention. Referring to FIG. 5, a wafer reactor 502 includes a plasma processing chamber 504. Above chamber 504, there is disposed a top electrode 506, which in this example, is implemented by a silicon showerhead electrode which includes a plurality of holes for releasing the etching gases as they come thorough a gas inlet 508. Top electrode 506 may be driven at an RF frequency ranging from about 13 MHz and about 40 MHz, preferably about 27 MHz in one embodiment by an RF generator 510 510 generator 510 generates power that may range from about 0 W to about 2500 W, preferably about 1200 W in one embodiment.

Within chamber 504, the etching gas chemistry is released through gas inlet 508 into the RF-induced plasma region between top electrode 506 and a wafer 512. The etching gas chemistry may also be released from ports built into the walls of the chamber itself. Wafer 512 is introduced into chamber 504 and disposed on an electrostatic chuck 514, which acts as the bottom electrode that is driven at a frequency between about 1 and about 4 MHz, preferably about 2 MHz in the preferred embodiment by a radio frequency generator 516. RF generator 516 generates power that may range from about 0 W to about 2500 W, preferably about 2200 W. Helium cooling gas may be introduced under pressure (e.g., about 5–30 Torr, preferably about 15 Torr, in one embodiment) between electrostatic chuck 514 and wafer 512 to act as a heat transfer medium for accurately controlling the wafer's temperature during processing to ensure uniform and repeatable etching results. The temperature of electrostatic chuck 514 may be kept between about −20° C. and about 40° C., preferably about 20° C., whereas the temperature of top electrode 506 may be kept between about 0° C. and 60° C., preferably at about 40° C. During plasma etching, the pressure within chamber 504 is preferably kept low, e.g., between about 10 mTorr to about 250 mTorr, preferably at about 67 mTorr in one embodiment.

The plasma reactor preferably comprises a medium density parallel plate (e.g., having a plasma density of about $3 \times 10^{10}$ ions/cm$^3$ to about $1 \times 10^{12}$ ions/cm$^{12}$ in a diode type or triode type plasma reactor. In such reactors, it is desirable to maintain the gap between the top electrode and the bottom electrode supporting the semiconductor substrate at a distance of about 1 cm to about 4 cm. The gap between the electrodes is maintained at about 1.3 cm in the preferred embodiment.

FIG. 6 shows, in accordance with one aspect of the present invention, the steps involved in the etching process using the improved etching gas chemistry. In step 600, the wafer is prepared for etching in a conventional pre-etch step. The wafer is, in this example, a semiconductor substrate comprising an electrically conductive or semiconductive layer underlying an oxide layer. The pre-etch step may include, for example, clamping the wafer onto the electrostatic chuck, stabilizing the pressure within the plasma processing chamber, and introducing helium cooling gas to the wafer backside to facilitate heat transfer between the wafer and the electrostatic chuck.

In step 602, etching of the silicon oxide layer takes place using the inventive etching gas chemistry. In one embodiment, the target layer is made of pure silicon dioxide. The etching gas chemistry may include a fluorocarbon gas, nitrogen and oxygen reactant gases, an inert carrier gas, and a hydrogen-containing additive gas.

The fluorocarbon gas comprises $C_nF_m$ wherein n is at least 2 and m is greater than n, for example, $C_2F_6$, $C_3F_6$, $C_4F_8$ and mixtures thereof. This gas provides the fluorine which etches the silicon oxide, as well as the carbon, which is believed to provide the polymer for passivating the side walls to cause the etch to proceed downwardly and not isotropically.

The carrier gas works as a diluent chemical and is believed to narrow ion scattering to assist in the etching process. This diluent may also serve as a source for physically bombarding the plasma and thereby enhancing the degree of dissociation of the plasma. The carrier gas can be selected from the group consisting of Ar, He, Ne, Kr, Xe, or mixtures thereof.

The oxygen and nitrogen gases are believed to react with the polymer to remove the polymer by forming CO and CN respectively. Because nitrogen is less effective than oxygen for polymer removal, by approximately a factor of 10, it is advantageously possible to fine-tune an etching process by adjusting the nitrogen flow rate, for example, if a particular oxygen flow rate results in etch stop for the size opening under consideration, nitrogen could be added until the etch stop problem is overcome.

The hydrogen-containing additive gas can be selected from the group including $C_4$, $H_2$, $H_2O$ and $NH_3$. The hydrogen component in these gases is vital to the improved etching gas chemistry. It is believed that hydrogen plays a critical role in the etching gas chemistry by performing many functions in its interaction with other components in the etching gas chemistry, for example, etching the silicon, improving the passivation on the sidewalls by changing the polymer chemistry as well as modifying the polymer formation at the bottom of the contact so that the polymer is easier to remove. This makes it easier to etch down further without the problems of bowed sidewalls and loss of critical dimension control.

The use of a fluorocarbon gas is known. By way of example, such use is disclosed in the commonly assigned U.S. Pat. No. 6,117,786 entitled "Method For Etching Silicon Dioxide Using Fluorocarbon Gas Chemistry" by Khajehnouri et al., which is incorporated herein by reference. Increasing the flow of fluorocarbon gas to increase etch rate and improve passivation on the side walls to avoid bowed sidewalls is however ineffective unless oxygen flow is increased as well in order to avoid an etch stop. However, increasing the flow of fluorocarbon gases and oxygen together tend to result in a greater loss of critical dimension control. It is believed that the use of hydrogen circumvents these problems while resolving the issues of bowed sidewalls and loss of critical dimension control. Furthermore, the use of nitrogen permits a finer degree of control over the process due to the relatively low polymer removal rate of nitrogen (relative to oxygen).

In step 604 of FIG. 6 the wafer may undergo additional post-etch processing steps that are conventional in nature. Thereafter, the finished wafer may be cut into dies which may then be made into IC chips. The resulting IC chip may then be incorporated in an electronic device, e.g., any of the well known commercial or consumer electronic devices, including digital computers.

FIG. 7 illustrates a cross-sectional view of a layer stack 700 before (depicted by solid lines) and after (depicted by dotted lines) etching of the oxide layer using the improved etching gas chemistry. Layer stack 700 is composed of a silicon substrate 702 underlying a silicon oxide layer 704, which in turn underlies a patterned photoresist layer 706. The process of etching oxide layer 704 takes place using the improved etching gas chemistry described earlier. The modified etching gas chemistry, employed in the manner discussed, allows for the etching of deep and narrow openings having substantially straight vertical profiles such as the exemplar opening 708 shown in the figure. Exemplar opening 708 has a substantially straight vertical profile that smoothly tapers at an approximate perpendicular angle θ that ranges, for example, between 88° and 90°.

Another advantage of the improved etching gas chemistry is its selectivity to photoresist. Given that the thickness of the photoresist that can be put on the oxide layer decreases with the reduction in feature size, the selectivity of the etching gas chemistry to photoresist becomes a very important factor in the etching process. It is imperative that the photoresist layer does not completely wear away before the etching of a deep and narrow opening in the oxide layer is completed. It has been found that the improved etching gas chemistry provides an oxide:photoresist selectivity ratio of approximately 12:1 to approximately 15:1, which is much higher than the selectivity ratio of approximately 5:1 provided by the prior art etching gas chemistry.

EXAMPLES

In the tables that follow, suitable parameters for etching through an exemplar layer stack are shown. The approximate process parameters shown therein are generally suitable for etching an 8-inch wafer on the aforementioned 4520XL plasma reactor. It should be readily apparent and within the skills of one skilled in the art that the parameters may be scaled and/or modified as appropriate to etch a substrate having a different dimension or to conform to the requirements of a specific plasma reactor.

Table 1 provides approximate ranges and approximate examples of suitable parameters for use in the plasma reactor such as the power (in watts), temperature (in degrees Celsius) and frequency (in MHz) of the top and bottom electrodes, the electrode gap, the plasma chamber pressure, and the helium pressure at the electrostatic chuck. Tables 2 and 3 illustrate the flow rates of the gas components of the etching gas chemistry. Table 2 provides the flow rates (in sccm) of some of the basic components of an exemplar etching gas chemistry, e.g., $C_4F_8$, oxygen, nitrogen, and argon. Table 3 provides the flow rates of the different types of hydrogen-containing additive gases (in percentages of the argon flow rate) that may be added to the improved etching gas chemistry to provide the hydrogen component for the etching process.

TABLE 1

| Etching Parameters: | Approximate Range | Approximate Exemplary Parameters |
|---|---|---|
| Electrostatic Chuck Temperature: | (−20)–(40)° C., | 20° C. |
| Top Electrode Temperature: | 0–60° C. | 40° C. |
| Bottom Power (2 MHz) | 0–2500 watts | 2200 W |
| Top Power (27 MHz) | 0–2500 watts | 1200 W |
| ESC He Pressure | 5–30 Torr | 15 Torr |
| Chamber Pressure | 10–250 mTorr | 67 mTorr |
| Electrode Gap | 1–4 cm | 1.3 cm |
| Top Electrode Frequency | 13–40 MHz | 27 MHz |
| Bottom Electrode Frequency | 1–4 MHz | 2 MHz |

TABLE 2

| Gas Flow (sccm) | Approximate Preferred | Approximate More Preferred | Approximate Most Preferred | Approximate Exemplary Parameters |
|---|---|---|---|---|
| C4F8 Flow | 3–15 | 4–10 | 5–7 | 6.5 |
| O2 Flow | 3–15 | 4–10 | 4–6 | 6.0 |
| N2 Flow | 1–100 | 10–80 | 15–40 | 20 |
| Ar Flow | 100–500 | 120–300 | 140–200 | 160 |

TABLE 3

| Percentage of hydrogen additive gas flow relative to Argon flow (%) | Approximate Preferred | Approximate More Preferred | Approximate Exemplary Parameters |
|---|---|---|---|
| $NH_3$ | 1–8 | 1–3 | 2 |
| $H_2$ | 1–10 | 1–5 | 4 |
| $CH_4$ | 1–10 | 1–3 | 2 |
| $H_2O$ | 1–15 | 1–8 | 5 |

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of etching an oxide layer in a plasma etching reactor, said method comprising:
   providing a semiconductor substrate into said plasma etching reactor, said semiconductor substrate comprising said oxide layer;
   flowing an etching gas that includes a fluorocarbon gas, a nitrogen reactant gas, an oxygen reactant gas, an inert carrier gas, and a hydrogen-containing additive gas into said plasma etching reactor; and
   etching an opening at least partially through said oxide layer, said etching of said oxide layer being performed using a plasma that is formed from said etching gas.

2. The method of claim 1, wherein said oxide layer comprises one of silicon dioxide, tetra ethyl oxysilane (TEOS), boro-phosphosilicate glass (BPSG), spin-on glass (SOG), and phosphosilicate glass (PSG).

3. The method of claim 1, wherein said inert carrier gas includes argon and said hydrogen-containing additive gas includes $CH_4$.

4. The method of claim 3 wherein the flow rate of said $CH_4$ is between about 1% and about 10% of a flow rate of the inert carrier gas.

5. The method of claim 3, wherein the flow rate of said $CH_4$ is between about 1% and about 3% of a flow rate of the inert carrier gas.

6. The method of claim 3, wherein the flow rate of said $CH_4$ is about 2% of a flow rate of the inert carrier gas.

7. The method of claim 1, wherein said inert carrier gas includes argon and said hydrogen-containing additive gas includes $H_2$.

8. The method of claim 7, wherein the flow rate of said $H_2$ is between about 1% and about 10% of a flow rate of the inert carrier gas.

9. The method of claim 7, wherein the flow rate of said $H_2$ is between about 1% and about 5% of a flow rate of the inert carrier gas.

10. The method of claim 7, wherein the flow rate of said $H_2$ is about 4% of a flow rate of the inert carrier gas.

11. The method of claim 1, wherein said inert carrier gas includes argon and said hydrogen-containing additive gas includes $H_2O$.

12. The method of claim 11, wherein the flow rate of said $H_2O$ is between about 1% and about 15% of a flow rate of the inert carrier gas.

13. The method of claim 11, wherein the flow rate of said $H_2O$ is between about 1% and about 8% of a flow rate of the inert carrier gas.

14. The method of claim 11, wherein the flow rate of said $H_2O$ is about 5% of a flow rate of the inert carrier gas.

15. The method of claim 1, wherein said inert carrier gas includes argon and said hydrogen-containing additive gas comprises $NH_3$.

16. The method of claim 15, wherein the flow rate of said $NH_3$ is between about 1% and about 8% of a flow rate of the inert carrier gas.

17. The method of claim 15, wherein the flow rate of said $NH_3$ is between about 1% and about 3% of a flow rate of the inert carrier gas.

18. The method of claim 15, wherein the flow rate of said $NH_3$ is about 2% of a flow rate of the inert carrier gas.

19. The method of claim 1, wherein said fluorocarbon gas comprises a $C_nF_m$ gas wherein n is at least 2 and m is greater than n, and said hydrogen-containing additive as is at least one of $CH_4$, $H_2$, $H_2O$, and $NH_3$.

20. The method of claim 19, wherein said fluorocarbon gas is $C_4F_8$.

21. The method of claim 1, wherein said plasma etching reactor is a parallel-plate type reactor.

22. The method of claim 1, wherein a frequency of a top electrode in said plasma etching reactor is supplied with an RF frequency of about 27 MHz during said etching.

23. The method of claim 22, wherein a frequency of a bottom electrode in said plasma etching reactor is supplied with an RF frequency of about 2 MHz during said etching.

24. A method of etching an oxide layer in a parallel-plate plasma etching reactor, said method comprising:
   providing a semiconductor substrate into said plasma etching reactor, said semiconductor substrate comprising said oxide layer;
   flowing an etching gas that includes a fluorocarbon gas having a formula of $C_nF_m$ gas wherein n is at least 2 and m is greater than n, $N_2$, $O_2$, an inert carrier gas, and a hydrogen-containing additive gas into said plasma etching reactor, and
   etching an opening at least partially through said oxide layer, said etching of said oxide layer being performed using a plasma that is formed from said etching gas.

25. The method of claim 24, wherein said etching is performed with a photoresist mask.

26. The method of claim 24, wherein said inert carrier gas includes argon and said hydrogen-containing additive gas includes $CH_4$ and wherein the flow rate of said $CH_4$ is between about 1% and about 10% of a flow rate of the inert carrier gas.

27. The method of claim 24, wherein said inert carrier gas includes argon and said hydrogen-containing additive gas includes $H_2$ and wherein the flow rate of said $H_2$ is between about 1% and about 10% of a flow rate of the inert carrier gas.

28. The method of claim 24, wherein said inert carrier gas includes argon and said hydrogen-containing additive gas includes $H_2O$ and wherein the flow rate of said $H_2O$ is between about 1% and about 15% of a flow rate of the inert carrier gas.

29. The method of claim 24, wherein said inert carrier gas includes argon and said hydrogen-containing additive gas comprises $NH_3$ and wherein the flow rate of said $NH_3$ is between about 1% and about 8% of a flow rate of the inert carrier gas.

30. The method of claim 24, wherein said fluorocarbon gas is $C_4F_8$.

31. The method of claim 24, wherein a frequency of a top electrode in said plasma etching reactor is supplied with an RF frequency of about 27 MHz during said etching.

32. A method of etching an oxide layer in a plasma etching reactor, said method comprising:

providing a semiconductor substrate into said plasma etching reactor, said semiconductor substrate comprising said oxide layer and a photoresist layer, said photoresist layer having been patterned to form an etch mask for said oxide layer;

flowing an etching gas that includes a fluorocarbon gas, a nitrogen reactant gas, an oxygen reactant gas, an inert carrier gas, and a hydrogen-containing additive gas into said plasma etching reactor, said hydrogen-containing additive gas being selected from the group consisting of $CH_4$, $H_2$, $H_2O$, and $NH_3$; and etching said oxide layer to form a deep and narrow opening through said oxide layer, said etching of said oxide layer being performed using a plasma that is formed from said etching gas, said deep and narrow opening having a width that is at most 0.25 microns, said deep and narrow opening having an aspect ratio that is at least 5:1, and said etching gas providing an oxide to photoresist selectivity ratio that is at least 12:1.

* * * * *